United States Patent
Rhein

[19]

[11] Patent Number: 5,811,979
[45] Date of Patent: Sep. 22, 1998

[54] PROTECTIVE GROUNDING JUMPER CABLE TESTER

[75] Inventor: David A. Rhein, Columbia, Mo.

[73] Assignee: Hubbell Incorporated, Orange, Conn.

[21] Appl. No.: 694,699

[22] Filed: Aug. 9, 1996

[51] Int. Cl.[6] .................................................. G01R 27/26
[52] U.S. Cl. ......................................... 324/718; 324/713
[58] Field of Search .................................. 324/705, 713, 324/715, 718, 539, 525, 522, 543, 541

[56] References Cited

U.S. PATENT DOCUMENTS

| | | | |
|---|---|---|---|
| 1,593,024 | 7/1926 | Macadie | 324/713 |
| 2,360,523 | 10/1944 | Simmons | 324/713 |
| 2,459,081 | 1/1949 | Kunz | 324/713 |
| 2,492,459 | 12/1949 | Bondurant | 324/713 |
| 2,510,691 | 6/1950 | Gilbert | 324/713 |
| 2,515,736 | 7/1950 | Saville et al. | 324/713 |
| 2,569,098 | 9/1951 | Hendricks et al. | 324/713 |
| 2,615,076 | 10/1952 | Miller | 175/183 |
| 2,862,179 | 11/1958 | Murphy | 324/51 |
| 3,772,593 | 11/1973 | Sidhu | 324/713 |
| 3,816,812 | 6/1974 | Alber et al. | 324/62 |
| 3,870,836 | 3/1975 | Kusama | 179/175.3 R |
| 3,870,953 | 3/1975 | Boatman et al. | 324/72.5 |
| 4,088,949 | 5/1978 | Goldish et al. | 324/713 |
| 4,399,402 | 8/1983 | Pelletier | 324/52 |
| 4,400,663 | 8/1983 | May | 324/52 |
| 4,408,157 | 10/1983 | Beaubien | 324/62 |
| 4,636,715 | 1/1987 | Borkowicz | 324/718 |
| 5,101,161 | 3/1992 | Walsh et al. | 324/543 |
| 5,436,554 | 7/1995 | Decker | 324/539 |
| 5,508,621 | 4/1996 | Wong | 324/713 |
| 5,614,832 | 3/1997 | Olsen | 324/713 |
| 5,631,570 | 5/1997 | King | 324/718 |

OTHER PUBLICATIONS

Inspec, Patent Associates Literature, Anderson et al, Journal of Physics vol. 8, No. 5, pp. 398–402 May 1975.

*Primary Examiner*—Maura K. Regan
*Attorney, Agent, or Firm*—Jerry M. Presson; Michael R. Swartz

[57] ABSTRACT

A protective grounding jumper cable tester is provided which includes a housing; a pair of jumper attachment terminals on the housing for attachment of a jumper cable therebetween; a dc voltage applying circuit disposed in the housing and connected to the pair of jumper attachment terminals for applying a direct current through a jumper cable attached between the jumper attachment terminals; and electronic means in the form of a PC board and microprocessor disposed in the housing and interconnected to the dc voltage circuit for applying a predetermined mathematical relationship to measure a resistance value of at least a portion of the jumper cable attached between the jumper attachment terminals. The electronic means in applying the predetermined mathematical relationship to measure the resistance value includes means for taking different voltage readings in accordance with Kelvin's measurement procedure and calculating the resistance value from the voltage readings in accordance with Kirchoff's current law.

5 Claims, 2 Drawing Sheets

PROTECTIVE GROUNDING JUMPER CABLE TESTER

CROSS REFERENCE TO RELATED APPLICATION

Reference is hereby made to the following U.S. application dealing with subject matter related to the subject invention: "Protective Grounding Jumper Cable Tester and Testing Method" by Clayton C. King, assigned U.S. Ser. No. 08/437,661 and filed May 9, 1995, now U.S. Pat. No. 5,631,570.

BACKGROUND OF THE INVENTION

1. Field of the Invention

The present invention generally relates to testing of grounding jumper cables and, more particularly, is concerned with a grounding jumper cable tester used for determining if the resistance of a grounding jumper cable to current flow is below a predetermined safe level.

2. Description of the Prior Art

During maintenance of a power line, it may become accidentally energized due to the inadvertent closing of a breaker or switch or due to mutual induction from parallel live lines. To protect workers from electric shock should a fault occur, grounding jumper cables are installed in various configurations to form a jumper system. Grounding jumper cables are conductive cables that have attachment means, such as clamps, at either end. The jumper system provides a path for current to flow around the worker to a neutral line or to the earth. However, in order for the jumper system to adequately protect the worker, it must provide a very low resistance path to current flow so that the voltage drop across the worker is maintained within a safe level should a fault occur.

The maximum allowable resistance of the jumper system can be determined based upon assumptions concerning the available fault current at the work site, the duration of the available fault current, and the level of safety to be provided. Once the maximum allowable jumper system resistance is determined, individual grounding jumper cables can be selected to form the jumper system. Since the resistance of the jumper system is determined primarily by the resistance of each of the individual jumper cables, it is necessary to determine the resistance of the individual jumper cables. Additionally, since they may be damaged during storage, transport or use, individual jumper cables should be periodically tested to ensure that their resistance remains suitable for the desired level of protection.

Grounding jumper cable tester devices exist, such as the one manufactured by Hasting's Fiberglass Corporation, that are designed to test the resistance of a jumper cable to current flow. The devices test the resistance of a jumper cable by relying on Ohm's law which defines the mathematical relationship between voltage, current and resistance. A known current is applied through the cable and the voltage drop across the cable is measured. With the current and voltage known, the resistance can be determined. However, the prior art jumper cable testing device identified above utilizes a current transformer to provide an alternating test current. This presents two significant drawbacks.

The first drawback is the inductance associated with alternating current. When alternating current flows through the jumper cable, inductance can function similar to resistance and cause a voltage drop. Such an induced voltage drop may result in an inaccurately high resistance determination. The effect of inductance is particularly acute if the cable is coiled or on a conductive surface. Thus, when using an alternating test current, it is critical to take steps to ensure that the jumper cable is positioned properly to minimize the possible effect of inductance.

The second drawback is the low testing voltage. Many jumper cables have aluminum clamps. A thin aluminum oxide coating forms on the clamps. This coating is highly resistant to current flow but easily breaks down when a sufficient voltage level, in the range of 5 to 10 volts, is applied. The voltage level encountered at work sites are more than sufficient to break down any aluminum oxide coating on the clamps making the resistance of the coating irrelevant. However, if sufficient voltage is not applied during testing, the thin aluminum oxide coating can raise the resistance of the jumper cable and result in the unnecessary rejection of the jumper cable. While the current transformer used in the prior known devices provides a sufficiently high alternating test current, it does so at the expense of voltage. The voltage drop created by prior alternating current jumper cable test devices is often inadequate to break down the aluminum oxide coating resulting in an inaccurate resistance determination and unnecessary rejection of the jumper cable.

The invention described and claimed in the above-identified patent application, which is assigned to the assignee of the present invention, addressed the shortcomings associated with prior art devices in providing a grounding jumper cable testing device and testing method that avoided the problem of inductance associated with alternating current and provided a sufficient voltage drop to break down any aluminum oxide coating on the clamps of the cable. In this prior device, an operator had to first adjust the quantity of current flowing through the jumper cable to a preselected quantity and then he would take a pair of test probes and bring them in contact with the jumper cable to sense the amount of resistance of the cable between the probe contact points and compare it to a predetermined safe resistance level. If the cable passed the initial test, then repeated tests were performed at different current levels having corresponding predetermined threshold resistance values to ensure that the cable was safe to use for its intended application. The multiple testing steps and adjustment operations are not only time consuming tasks but they also have the potential of operator error.

Consequently, a need exists for a grounding jumper cable testing device which is more automatic in operation so as to reduce the number of steps in the testing procedure and the time required to carry out the testing operation and a testing device that not only produces very accurate and reliable testing results but also one that substantially reduces the possibilities of operator error.

SUMMARY OF THE INVENTION

The present invention provides a protective grounding cable tester designed to satisfy the aforementioned needs by avoiding the drawbacks of the prior art without introducing other drawbacks. Accordingly, the present invention is directed to a protective grounding jumper cable tester used for determining whether a grounding jumper cable has an adequately low resistance to current flow so that it may be safely used in a jumper system. The tester of the present invention uses direct current to measure resistance in the jumper cable and the output current of the jumper cable is limited to a specified maximum amount by an internal current limiting resistor.

The protective grounding jumper cable tester of the present invention basically includes: (a) a housing which may be portable for field use of the tester; (b) a pair of jumper attachment terminals on the housing; (c) a dc voltage applying circuit disposed in the housing and connected to the pair of jumper attachment terminals for applying a direct current through a jumper cable attached between the jumper attachment terminals; and (d) electronic means disposed in the housing and interconnected to the dc voltage circuit for applying a predetermined mathematical relationship to measure a resistance value of at least a portion of the jumper cable attached between the jumper attachment terminals. The dc voltage circuit includes a dc power supply, preferably of 5 volts, having first and second terminals. The first terminal of the power supply is interconnected by a first wire lead to a first one of the pair of jumper attachment terminals and the second terminal of the power supply is interconnected by a second wire lead to a second one of the pair of jumper attachment terminals. A known resistance, preferably having a value of 0.5 ohms, is connected in series in the first wire lead and disposed between the first terminal of the power supply and the first jumper attachment terminal to limit the amount of current (preferably 10 amps) flowing through the circuit when a jumper cable to be tested is attached between the first and second jumper attachment terminals.

Preferably, the electronic means is in the form of a PC board with a microprocessor to automatically and reliably measure the resistance value of at least a portion of the jumper cable attached between the jumper attachment terminals. In applying the predetermined mathematical relationship to measure the resistance value of the jumper cable, the electronic means includes means for taking different voltage readings in accordance with Kelvin's measurement procedure and calculating the resistance value from the voltage readings in accordance with Kirchoff's current law. The electronic means also includes indicator means for indicating to an operator whether the measured resistance value of the cable is greater or less than a preselected resistance value for a given size cable.

And for trouble shooting operations, to locate different portions of the jumper cable which may have a high resistance value, the tester further includes a pair of test probe terminals interconnected to the electronic means and disposed on the housing for connection with a pair of test probes for sensing resistance of a portion of the jumper cable between selected probe contact points. A switch, connected to the electronic means, is provided for selection between a fixed mode for taking a voltage reading across the jumper attachment terminals and a probe mode for taking a voltage reading across the probe contact points.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which.

DETAILED DESCRIPTION OF THE INVENTION

Figure 1:
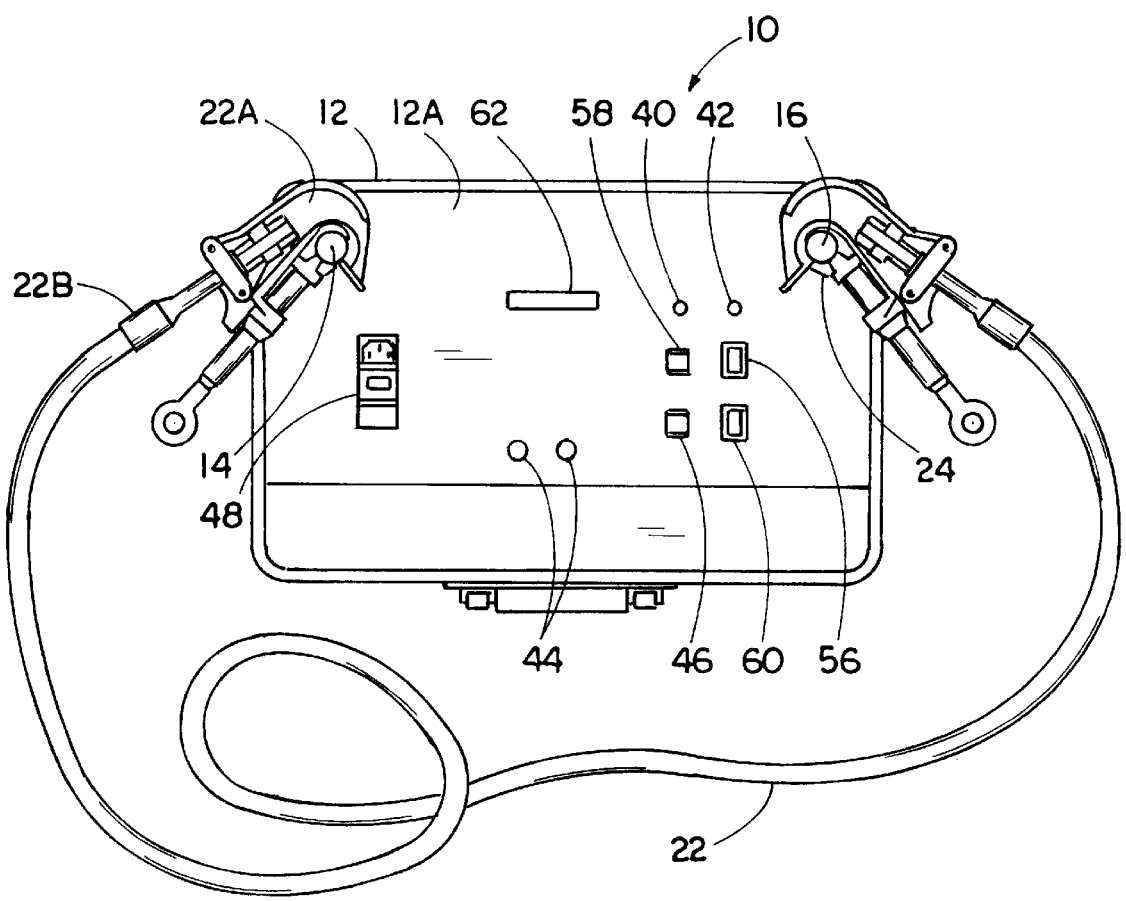
FIG. 1 is a top plan view of a protective grounding jumper cable tester of the present invention, with its top enclosure cover being removed and with a typical grounding jumper cable having clamps on each end being attached to the jumper attachment terminals of the tester to begin a test of the cable.

In the following description, like reference characters designate like or corresponding parts throughout the several views. Also in the following description, it is to be understood that such terms as "forward", "rearward", "left", "right", "upwardly", "downwardly", and the like, are words of convenience and are not to be construed as limiting terms.

Referring now to the drawings, and particularly to FIG. 1, there is illustrated a protective grounding jumper cable tester of the present invention, being generally designated 10. The tester 10 includes a housing 12 which preferably, although not necessarily, is portable for readily accommodating field use of the tester. The tester 10 also has a cover (not shown) attached to the housing 12 by a pair of hinges (not shown) for pivotally closing the cover during periods of non-use and opening the cover to gain access to the components therein, which are described below, for using the tester 10.

The basic components of the tester 10 include a pair of jumper attachment terminals 14, 16; a dc voltage applying circuit 18; and electronic means 20 for automatically measuring the resistance value of at least a portion of a jumper cable 22 attached between the jumper attachment terminals 14, 16 by applying a predetermined mathematical relationship.

Figure 2:
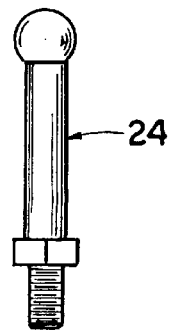
FIG. 2 is an elevational view of a removable terminal post that threadably attaches to the jumper attachment terminal of the tester.

The jumper attachment terminals 14, 16 are mounted on the top panel 12A of the housing 12 adjacent the rear corners thereof, and preferably, each attachment terminal 14, 16 is internally threaded for receiving an externally threaded removal terminal attachment extension post 24, such as the one shown in FIG. 2, which threads into and from the terminal 14, 16 to respectively deploy the post for use and remove the post for storage in the housing 12. Posts 24 having different sizes and shapes may be provided for facilitating the attachment of jumper clamps 22A having clamps of different sizes and shapes.

Figure 3:
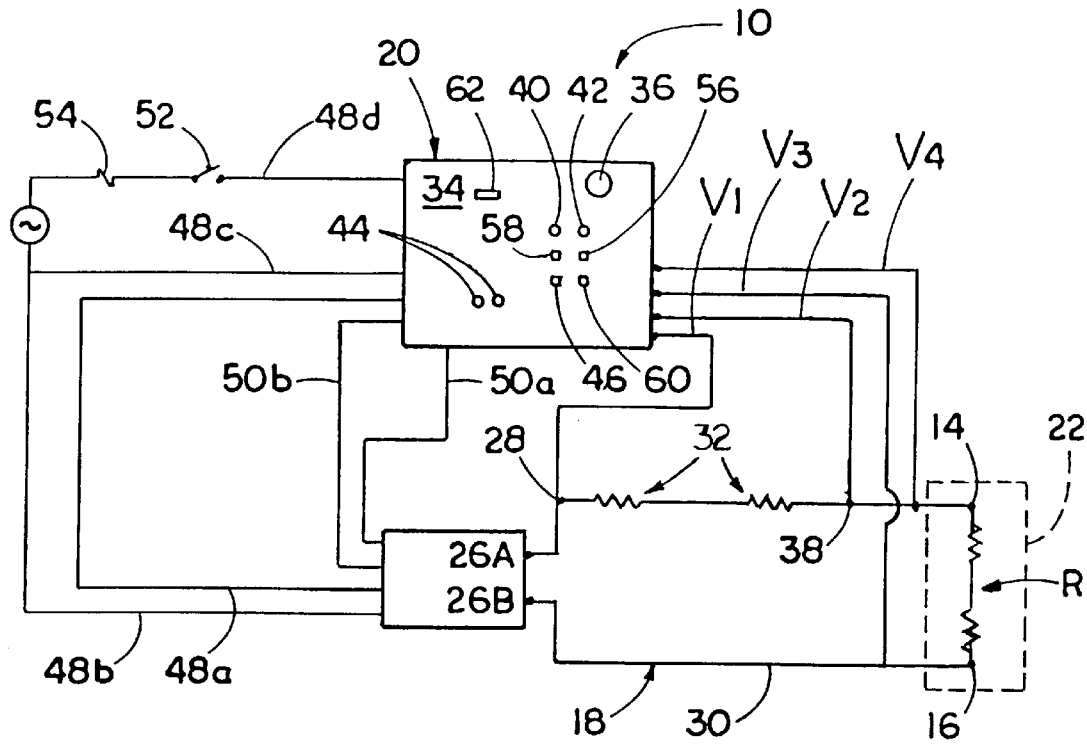
FIG. 3 is an electrical block diagram illustrating the functional operations of the tester shown in FIG. 1 for testing the resistance of a jumper cable in accordance with the present invention, the tester being shown in the fixed mode for taking a voltage reading across the jumper attachment terminals.
Figure 4:
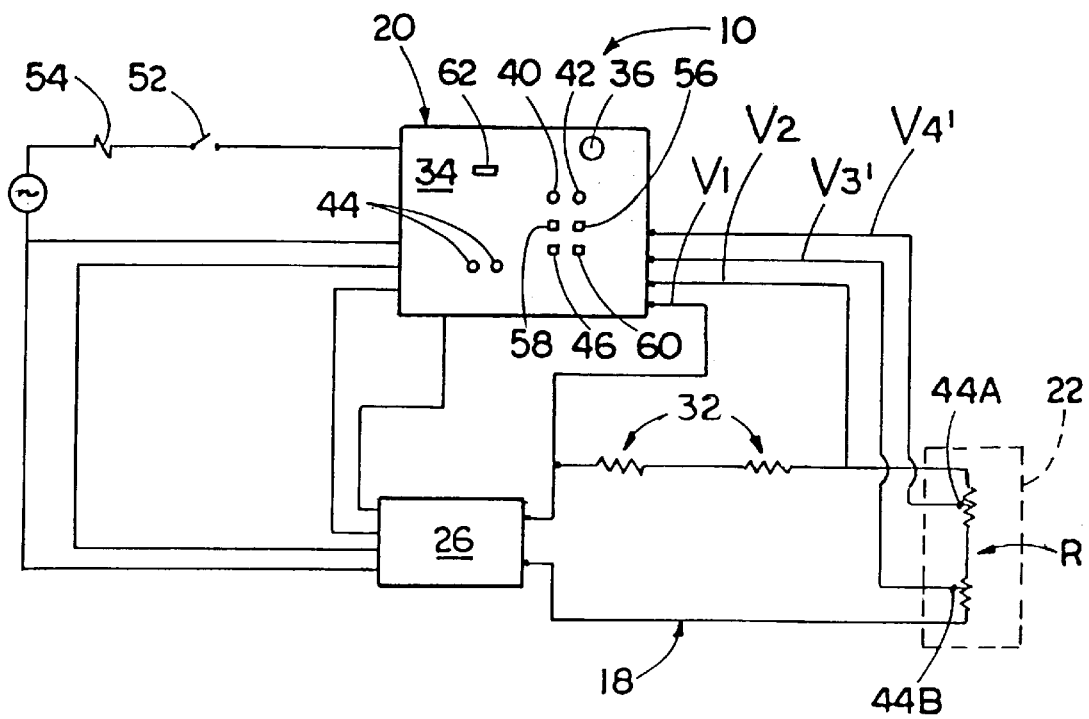
FIG. 4 is a view identical to FIG. 3 but with the tester being shown in the probe mode for taking a voltage reading across the probe contact points.

The dc voltage applying circuit 18, as diagrammatically illustrated in FIGS. 3 and 4, is disposed in the housing 12 and connected to the pair of jumper attachment terminals 14, 16 and operable to apply a direct current through the jumper cable 22 attached between the jumper attachment terminals 14, 16. More particularly, the dc voltage applying circuit 18 includes a dc power supply 26 having first and second terminals 26A, 26B; a first wire lead 28 interconnecting the first terminal 26A of the power supply 26 and a first one 14 of the pair of jumper attachment terminals 14, 16; a second wire lead 30 interconnecting the second terminal 26B of the power supply 26 and a second one 16 of the pair of jumper attachment terminals 14, 16; and a known resistance ($R_k$) 32 connected in series in the first wire lead 28 and disposed between the first terminal 26A of the power supply 26 and the first jumper attachment terminal 14 to limit the amount of current flowing through the circuit 18 when the jumper cable 22 is attached between the first and second jumper attachment terminals 14, 16. Preferably, the dc power supply 26 is a 5 volt supply and the known resistance 32 has a value of 0.5 ohms so that the maximum current flowing through the circuit 18 is limited to 10 amps. In the preferred embodiment, the known resistance 32 takes on the form of two separate resistors, a 0.2 ohm resistor and a 0.3 ohm resistor, connected in series in the first wire lead 28 so as to reduce the wattage requirement of each resistor 32.

Still referring to FIGS. 3 and 4, the electronic means 20, being illustrated in block diagram form, takes on the form of a PC board 34 with a microprocessor 36 to measure the resistance value of the jumper cable 22 by taking different voltage readings in accordance with the well-known Kelvin's measurement procedure and then calculating the resistance value from these voltage readings in accordance with Kirchoff's current law, also a very known principal to those skilled in the art.

Although, the taking of two voltage readings is sufficient for this calculation, the tester 10, in accordance with the preferred embodiment, uses a four single sided voltage measurement approach to obtain accurate resistance measurements. When the whole length of the cable 22 is being tested, as depicted in FIG. 3, the four Kelvin voltage readings are as follows:

(1) a first voltage reading $V_1$ is taken between the first and second terminals 26A, 26B of the power supply 26;

(2) a second voltage reading $V_2$ is taken between the second terminal 26B of the power supply 26 and a first location 38 on the first wire lead 28 located between the known resistance 32 and the first jumper attachment terminal 14;

(3) a third voltage reading $V_3$ is taken between the second terminal 26B of the power supply 26 and the first jumper attachment terminal 14; and (4) a fourth voltage reading $V_4$ is taken between the second terminal 26B of the power supply 26 and the second jumper attachment terminal 16.

From these four voltage readings $V_{1-4}$, the microprocessor 36 calculates the resistance value R for the test jumper cable 22 in accordance with Kirchoff's current law as follows: $R=(V_2-V_1)$ divided by $(V_4-V_3)$ times the known resistance $R_k$ (known resistance); in other-words, subtract the second voltage reading $V_2$ from the first voltage reading $V_1$ to obtain a first difference, subtract the fourth voltage reading $V_4$ from the third voltage reading $V_3$ to obtain a second difference, divide the first difference by the second difference to obtain a quotient, and then multiply the quotient by the known resistance Rk (32) to thereby obtain the measured resistance R.

Once the measured resistance value R of the jumper cable 22 has been calculated as described above, the microprocessor 36 compares it to a preselected (threshold) resistance value for a given diameter size cable. If the measured resistance value R is greater than the preselected resistance value, the tester 40, via a red indicator light 40, mounted on the top panel 12A of the housing 12 and electrically connected (not shown) to the electronic means 20 energizes the light to notify an operator that the jumper cable 22 failed the test and thus should be inspected and retested as set forth in the test and inspect section of the above cross-referenced application. On the otherhand, should the measured resistance value R of the jumper cable 22 be less than the preselected resistance value, a green indicator light 42, mounted adjacent the red light 40 on the top panel 12A of the housing 12 and electrically connected (not shown) to electronic means 20 is energized to notify the operator that the jumper cable 22 has passed the test and that the tested jumper cable 22 is safe for its intended use.

For troubleshooting, in identifying what portions or components of the jumper cable 22 may be an area of high resistance, the tester 10 further includes pair of test probe terminals 44 interconnected to the electronic means 20 and mounted on the top panel 12A of the housing 12 for connection with a pair of test probes (not shown) for sensing resistance of a portion of the jumper cable between selected probe contact points 44A, 44B on cable 22. A selector input switch 46, mounted on the top panel 12A of the housing 12, is connected to the electronic means 20 for switching between a "fixed mode" wherein the above described voltage readings $V_3$ and $V_4$ are taken across the jumper attachment terminals 14, 16 and a "probe mode" for taking voltage readings $V_{3'}$ and $V_{4'}$ across the probe contact points 44A, 44B located on a portion of the jumper cable 22, as illustrated in FIG. 4. The FIG. 4 illustration is identical to the FIG. 3 illustration, except that in FIG. 3, the respective voltage readings are taken across the jumper attachment terminals 14, 16 whereas in FIG. 4, the corresponding voltage readings are taken across the probe contact points 44A, 44B which represent a portion of the jumper cable 22, such as one of the clamps 22A on the opposite ends of the cable, or one of the ferrules 22B used to attach a clamp to the cable. As can be appreciated, when calculating the resistance value R form the four voltage readings as described above, the $V_{3'}$ and $V_{4'}$ readings are substituted for the $V_3$ and $V_4$ readings when the input selector switch 46 is in the probe mode and the test probes (not shown) are used to test a portion of the cable.

Referring back to FIG. 1, as well as FIGS. 3 and 4, the tester 10 includes a power entry module 48 having a receptacle for receiving a plug (not shown) of a power cord (not shown) to connect the power supply 26 and the PC board 34, via wire leads 48a, 48b, 48c, 48d, to a source of alternating current, such as a conventional sixty-cycle utility power receptacle. As known, the power supply 26 receives alternating current and converts it into direct current. Also the PC board 34 is interconnected to the power supply 26 via wire leads 50a, 50b for automatically turning the power supply 26 on and off. The power module 48 is mounted on the top panel 12A of the housing 12 and includes a main power switch 52 which illuminates when power to the tester 10 is on and a fuse 54 for protecting the circuitry of the tester 10. Also mounted on the top panel 12A of the housing 12 is a cable size indicator switch 56, a continuous test switch 58, a single test switch 60, and a visual display unit 62 which are all operably connected to the electronic means 20. The cable switch 56 allows an operator to select the size of the cable to be tested which size is displayed in the display window of the display unit 62 along with the preset resistance threshold value of the particular size cable being tested. Also displayed in the display unit 62 is the measured resistance value of the complete jumper cable 22 length between the fixed jumper attachment terminals 14, 16 when the input selector switch 46 is in the probe mode. The single test switch 60 allows the tester 10 to make a single resistance measurement and then holds this value whereas the continuous test switch 58, when switched on, allows the tester 10 to continuously make measurements at the rate of one per second and when in the off position, the tester 10 will hold the last measurement made.

Briefly, the procedure for using the tester 10 is as follows: First the attachment extension posts 24 are threaded into the respective jumper attachment terminals 14, 16 and the cable 22 is attached to the jumper attachment terminals 14, 16 as shown in FIG. 1. The power switch 52 is then turned on to energize the various above described components. The size of the cable to be tested is then selected by use of the cable size switch 56 which displays the size in the display unit 62 as well as the threshold resistance value of the particular size cable. The input selector switch 46 is moved to the fixed position and the continuous test switch 58 is placed in the off position. The single test switch 60 is then pressed to complete the test and the tested resistance value R is displayed in the display unit 62. The red indicator light 40 will illuminate if the tested resistance is above the preset threshold shown in the display and the green light 42 will illuminate if the tested resistance is below the preset threshold. It should be noted here that the jumper cable 22 being tested is always connected between the jumper attachment terminals 14, 16 regardless of the mode of testing, in the fixed mode or the probe mode. Should a cable initially fail the above test, the operator can use the tester 10 easily to identify the high resistance areas of the cable by switching from the fixed mode to the probe mode and connecting a set of probes (not shown) to the probe terminals 44. The continuous test switch 58 is switched to the on position so that the tester 10 repeatedly make measurements at a rate of one per second until the high resistance area is located. In this probe mode, the display unit 62 will show the resistance across the portion of the jumper cable 22 to which the probe ends contact. The display unit 62 will show the measured resistance form one probe contact point 44A to the other probe contact point 44B, as illustrated in FIG. 4. As above, the red light 40 will illuminate if the measured resistance value is greater than the preset resistance value whereas the green light 42 will illuminate if the measured resistance value is less than the preset threshold value.

It is thought that the present invention and its advantages will be understood from the foregoing description and it will be apparent that various changes may be made thereto without departing from the spirit and scope of the invention or sacrificing all of its material advantages, the form hereinbefore described being merely preferred or exemplary embodiment thereof.

I claim:

1. A protective grounding jumper cable tester, comprising:
   (a) a housing;
   (b) a pair of jumper attachment terminals on said housing for attachment of a jumper cable therebetween;
   (c) a dc voltage applying circuit disposed in said housing and connected to said pair of jumper attachment terminals for applying a direct current through a jumper cable attached between said jumper attachment terminals upon actuation of a single test switch by an operator to retain and hold a single test measurement, said dc voltage circuit including
      (i) a 5 volt dc power supply having first and second terminals;
      (ii) a first wire lead interconnecting said first terminal of said power supply and a first one of said pair of jumper attachment terminals;
      (iii) a second wire lead interconnecting said second terminal of said power supply and a second one of said pair of jumper attachment terminals; and
      (iv) a known resistance in the form of a 0.2 ohm resistor and a 0.3 ohm resistor for low wattage connected in series in said first wire lead and disposed between said first terminal of said power supply and said first jumper attachment terminal so as to limit the maximum amount of current flowing through said circuit to 10 amps when a jumper cable to be tested is attached between said first and second jumper attachment terminals;
   (d) electronic means disposed in said housing and interconnected to said dc voltage circuit for taking different voltage readings and then applying a predetermined mathematical relationship to measure a resistance value of at least a portion of said jumper cable attached between said jumper attachment terminals, said electronic means including a microprocessor for automatically calculating said resistance value of said jumper cable and then comparing said resistance value to a preselected resistance value for a given diameter size cable;
   (e) a pair of test probe terminals interconnected to said electronic means and disposed on said housing for connection with a pair of test probes for sensing resistance of a portion of said jumper cable between selected probe contact points;
   (f) a continuous test switch interconnected to said dc voltage circuit and switchable between an on position for applying said direct current of said dc voltage applying circuit to continuously make test measurements at the rate of one per second and an off position wherein the last measurement taken is retained; and
   (g) a selector switch connected to said electronic means and switchable between a fixed mode for taking a voltage reading across said jumper attachment terminals when said continuous test switch is in said off position and a probe mode for taking a voltage reading across said probe contact points when said continuous test switch is in said on position.

2. The tester as recited in claim 1, wherein said electronic means in applying said predetermined mathematical relationship to measure the resistance value includes means for taking different voltage readings in accordance with Kelvin's measurement procedure and calculating the resistance value from the voltage readings in accordance with Kirchoff's current law.

3. The tester as recited in claim 2, wherein said electronic means further includes indicator means for indicating to an operator whether said measured resistance value is greater or less than a preselected resistance value.

4. The tester as recited in claim 1, wherein said electronic means in applying said predetermined mathematical relationship to measure the resistance value includes means for taking:
   a first voltage reading between said first and second terminals of said power supply;
   a second voltage reading between said second terminal of said power supply and a first location on said first wire lead located between said known resistance and said first jumper attachment terminal;
   a third voltage reading between said second terminal of said power supply and a first location on said jumper cable located between said first and second jumper attachment terminals; and
   a fourth voltage reading between said second terminal of said power supply and a second location on said jumper cable located between said first and second jumper attachment terminals, one of said first and second locations on said jumper cable being closer to said known resistance than the other one of said first and second locations on said jumper cable.

5. The tester as recited in claim 4, wherein said electronic means in applying said predetermined mathematical relationship to measure the resistance value further includes means for calculating said resistance value of at least a portion of said jumper cable attached between said jumper attachment terminals by subtracting the second voltage reading from the first voltage reading to obtain a first difference, subtracting the fourth voltage reading from the third voltage reading to obtain a second difference, dividing the first difference by the second difference to obtain a quotient, and then multiplying the quotient by the known resistance in thereby obtaining said resistance value.

* * * * *